(12) United States Patent
Xu et al.

(10) Patent No.: US 6,255,039 B1
(45) Date of Patent: *Jul. 3, 2001

(54) FABRICATION OF HIGH DENSITY MULTILAYER INTERCONNECT PRINTED CIRCUIT BOARDS

(75) Inventors: Chengzeng Xu, Succasunna; James T. Yardley, Morristown; David Haas, Westfield, all of NJ (US); Michael Vallance, La Crosse; Jeffrey T. Gotro, Onalaska, both of WI (US); Michael A. Petti, Buffalo Grove, IL (US)

(73) Assignee: Isola Laminate Systems Corp., LaCrosse, WI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/054,264

(22) Filed: Apr. 3, 1998

Related U.S. Application Data

(60) Provisional application No. 60/044,069, filed on Apr. 16, 1997.

(51) Int. Cl.[7] .................................................. G03F 7/26
(52) U.S. Cl. .......................... 430/318; 430/313; 430/316; 428/96
(58) Field of Search .................................. 430/312, 313, 430/314, 316, 318; 428/96

(56) References Cited

U.S. PATENT DOCUMENTS

| | | | |
|---|---|---|---|
| 3,319,317 | 5/1967 | Roche et al. | 29/155.5 |
| 3,778,900 | 12/1973 | Haining et al. | 29/628 |
| 4,642,160 | * 2/1987 | Burgess | 156/630 |
| 4,672,020 | * 6/1987 | Koelsch et al. | 430/166 |
| 4,915,983 | 4/1990 | Lake et al. | 427/98 |
| 4,952,528 | * 8/1990 | Abe et al. | 437/194 |
| 5,334,487 | 8/1994 | Kindle et al. | 430/312 |
| 5,354,593 | 10/1994 | Grandmont et al. | 428/137 |
| 5,451,721 | 9/1995 | Tsukada et al. | 174/261 |
| 5,595,858 | 1/1997 | Akama et al. | 430/314 |
| 5,744,285 | * 4/1998 | Felten et al. | 430/318 |

FOREIGN PATENT DOCUMENTS 195 05 555    8/1996   (DE) .

* cited by examiner

*Primary Examiner*—Kathleen Duda
(74) *Attorney, Agent, or Firm*—McDonnell Boehnen Hulbert & Berhgoff

(57) ABSTRACT

High density built-up multilayer printed circuit boards are produced by constructing microvias with photoimageable dielectric materials. A photosensitive dielectric composition on a conductive foil is laminated to conductive lines on a core. After imaging the foil and imaging and curing the photosensitive dielectric composition, vias are formed to the conductive lines. Thereafter the conductive lines are connected through the vias to the conductive foil, and then the conductive foil is patterned.

24 Claims, 3 Drawing Sheets

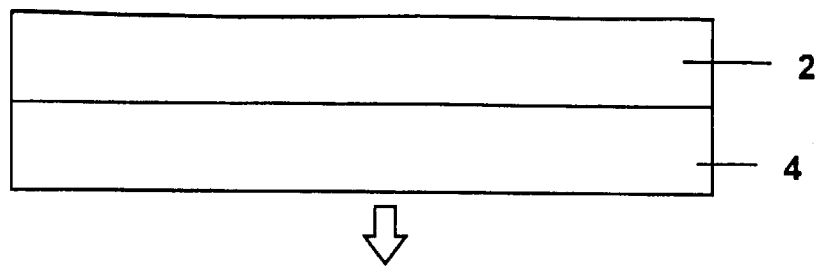
FIGURE 1
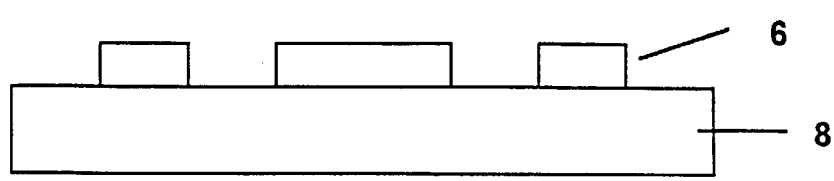
FIGURE 2
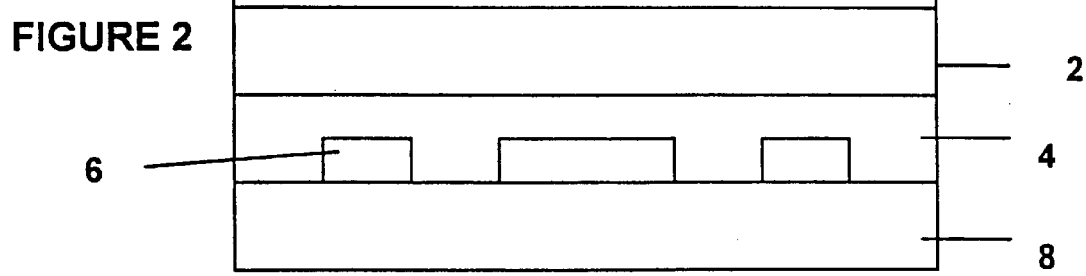
FIGURE 3
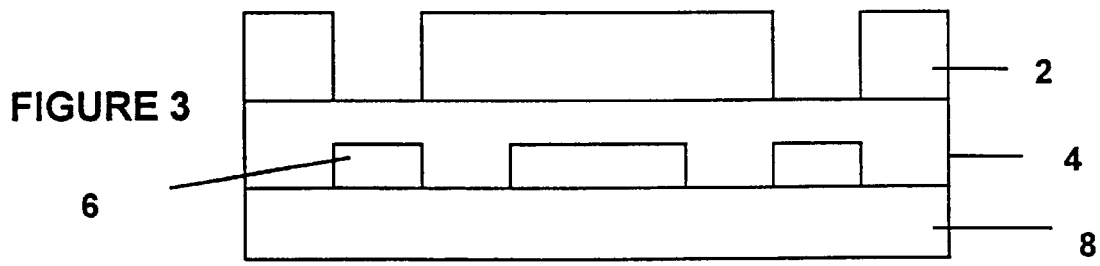

FABRICATION OF HIGH DENSITY MULTILAYER INTERCONNECT PRINTED CIRCUIT BOARDS

CROSS REFERENCE TO RELATED APPLICATION

This application claims the benefit of copending provisional application 60/044,069 filed Apr. 16, 1997.

BACKGROUND OF THE INVENTION

1. Field of the Invention

The invention pertains to the production of printed circuit boards. More particularly, the invention concerns the production of high density built-up multilayer circuit boards by constructing microvias with photoimageable dielectric materials.

2. Description of the Prior Art

As the need for faster, smaller, less expensive integrated circuit products continues grow, the ability to wire-bond reaches the limits of the available technology and chips must be mounted using a flip-chip approach and solder bumps. This leads to a direct chip attachment package. The requirement to fan-out the high number of I/O's from the underside of the chip places increasing demands on utilization of the printed circuit board area. Plated-through-holes use too much space and block routing channels. This drives the need for a high density package with a significant number of interconnections on the outer surface of the board as well as for increasing use of blind microvias.

Resin coated copper (RCC) has been used in the past to economically fabricate high density built-up multilayer circuit boards. Currently microvias in such circuit boards fabricated with RCC are produced by two methods, including plasma etching and laser drilling. As such, only printed circuit fabricators with access to plasma etching or laser drilling equipment can provide these advanced, blind-via boards. The high cost of the plasma and laser equipment hinders widespread adoption of RCC technology. Furthermore, the technical disadvantages associated with the plasma etching and laser drilling techniques, such as undercutting due to isotropic etching of plasma, and low throughput due to sequential drilling by laser, also limit large scale commercialization of RCC based high density multilayer circuit boards.

Alternatively, photovia processes, which use photoimageable dielectric materials to fabricate builtup multilayer printed circuit boards have been developed. In theses processes, photodielectrics are coated on a patterned core and photoimaged to define via holes. The via holes along with the surface of the dielectric layer are then plated with copper. U.S. Pat. No. 5,354,593 sequentially laminates and photoimages two photodielectrics onto a conductive core to define via holes and then copper plates the via holes. U.S. Pat. No. 5,451,721 produces a multilayer printed circuit board by applying a photosensitive resin layer onto a core having a metal line on its surface. After imaging to form via holes, the resin layer is deposited with a copper layer by electroless plating techniques. U.S. Pat. No. 5,334,487 produces a pattered layer on a substrate by applying and exposing different photosensitive compositions on opposite sides of a copper foil. One side is developed and the copper etched, followed by developing the other side and metallization of through holes.

The foregoing photovia technologies allow for fabrication of high density interconnection printed circuit boards with conventional equipment but they suffer from similar drawbacks such as difficult copper plating processes and poor resin-to-copper adhesion. These problems usually lead to poor reliability of the circuit boards. These problems are solved by the present invention whereby a photosensitive dielectric composition on a conductive foil is laminated to conductive lines on a substrate. After imaging the foil, and imaging and curing the photosensitive dielectric composition, vias are formed to the conductive lines. Thereafter the conductive lines are connected through the vias to the conductive foil, and then the conductive foil is patterned.

SUMMARY OF THE INVENTION

The invention provides a process for producing a printed circuit board which comprises:

(a) attaching a photosensitive element onto a pattern of conductive lines on the surface of a substrate; which photosensitive element comprises a negative working photosensitive dielectric composition on a surface of a conductive foil, such that the photosensitive dielectric composition is positioned on the conductive lines;

(b) applying a layer of a photoresist onto an opposite surface of said foil;

(c) imagewise exposing the photoresist to actinic radiation and developing the photoresist to thereby form imagewise removed and imagewise nonremoved portions of the photoresist such that the imagewise removed portions are above at least some conductive lines;

(d) removing the portions of the conductive foil underlying the imagewise removed portions of the photoresist without removing the underlying photosensitive dielectric composition;

(e) imagewise exposing a portion of the photosensitive dielectric composition to actinic radiation through the removed portions of the conductive foil; developing the photosensitive dielectric composition to thereby form imagewise removed and imagewise nonremoved portions of the photosensitive dielectric composition such that the imagewise removed portions form vias to the conductive lines;

(f) curing the nonremoved portions of the photosensitive dielectric composition;

(g) electrically connecting the conductive lines through the vias to a part of the conductive foil; and (h) patterning the conductive foil to thereby produce a pattern of conductive foil lines.

The invention also provides a process for producing a printed circuit board which comprises applying a layer of a negative working photosensitive dielectric composition onto a surface of a conductive foil thereby forming a photosensitive element and then following steps (a) through (h) above.

The invention further provides process for producing a printed circuit board which comprises:

(a) attaching a photosensitive element onto a pattern of conductive lines on the surface of a substrate; which photosensitive element comprises a negative working photosensitive dielectric composition on a surface of a conductive foil, such that the photosensitive dielectric composition is positioned on the conductive lines;

(b) removing the conductive foil;

(c) imagewise exposing a portion of the photosensitive dielectric composition to actinic radiation and developing the dielectric composition to thereby form imagewise removed and imagewise nonremoved portions of the dielectric composition such that the imagewise removed portions are above at least some conductive lines thus forming vias to the conductive lines;

(d) curing the nonremoved portions of the photosensitive dielectric composition;

(e) simultaneously forming an electrically conductive layer on the nonremoved portions of the dielectric composition and electrically connecting the conductive lines through the vias to the electrically conductive layer; and (f) patterning the electrically conductive layer to thereby produce a pattern of conductive lines.

The invention still further provides a process for producing a printed circuit board which comprises applying a layer of a negative working photosensitive dielectric composition onto a surface of a conductive foil thereby forming a photosensitive element and then following steps (a) through (f) in the preceding paragraph.

By the process of the invention microvias are produced by using negative acting photosensitive resin coated metals such as copper. This product and process allows a substantial reduction in the cost of printed circuit board fabrication process as compared to plasma or laser drilling techniques. The photo microvia technology also avoids the technical barriers associated with the plasma and laser drilling methods such as undercutting due to isotropic etching of plasma and low throughput due to sequential drilling by laser. As compared with the existing photovia technologies, this invention permits easy copper plating and better copper-to-resin adhesion.

BRIEF DESCRIPTION OF THE DRAWINGS

FIG. 1 shows a schematic view of a photosensitive element according to the invention laminated to a printed substrate having metallic lines.

FIG. 2 shows a post lamination view of a photosensitive element positioned on the substrate and after a photoresist is applied to the opposite side of the photographic element.

FIG. 3 shows the structure of FIG. 3 after photoresist removal and foil imaging

DETAILED DESCRIPTION OF THE PREFERRED EMBODIMENT

Figure 4:
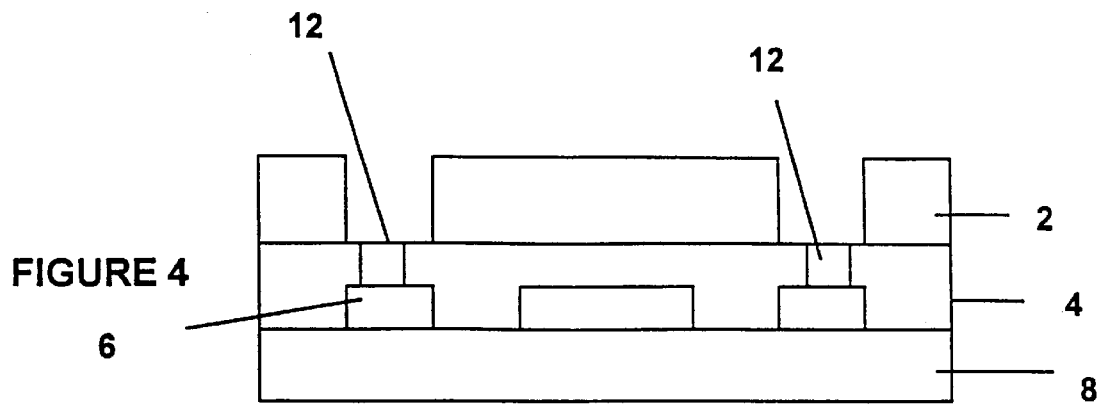
FIG. 4 shows the structure of FIG. 3 after an imaging of the dielectric composition.

One performs a first process embodiment of the invention by employing a photosensitive element which comprises a negative working photosensitive dielectric composition applied on a surface of a conductive foil. The negative working photosensitive dielectric composition is one which is suitable for use as a permanent dielectric in electronic circuits.

Suitable conductive foils include copper, copper alloys, aluminum, aluminum alloy, and the like, however, copper foils are most preferred.

Suitable negative working photosensitive dielectric compositions include photopolymerizable compositions which comprise at least one photopolymerizable compounds contain at least two olefinically unsaturated double bonds, such as acrylates plus a free radical photoinitiator. Other negative working photoimageable compositions may be produced by admixing a photoacid generator capable of generating an acid upon exposure to actinic radiation with a polymer precursor, such as an epoxy precursor, which fonms polymers upon contact with the generated acid together with an optional, but preferred, organic acid anhydride monomer or polymer and an optional but preferred phenol-containing monomer or polymer. A combination of both types of working photosensitive dielectric compositions is also within the purview of the invention.

Suitable photopolymerizable compounds containing at least two olefinically unsaturated double bonds are well known in the art. Suitable for use as polymerizable compounds are ethers, esters and partial esters of acrylic and methacrylic acid and aromatic and aliphatic polyols containing preferably 2 to 30 carbon atoms, or cycloaliphatic polyols containing preferably 5 or 6 ring carbon atoms. These polyols can also be modified with epoxides such as ethylene oxide or propylene oxide. The partial esters and esters of polyoxyalkylene glycols are also suitable. Examples are ethylene glycol dimethacrylate, diethylene glycol dimethacrylate triethylene glycol dimethacrylate, tetraethylene glycol dimethacrylate, polyethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates of polyethylene glycols having an average molecular weight from 100 to 1500, ethylene glycol diallyl ether, 1,1,1-trimethylolpropane triallyl ether, pentaerythritol triallyl ether, diallyl succinates and diallyl adipates or mixtures of the above compounds. Preferred multifunctional acrylate oligomers include, but are not limited to acrylated epoxies, acrylated polyurethanes, and acrylated polyesters. The photopolymerizable compound is present in an amount sufficient to photopolymerize upon exposure to sufficient actinic radiation. In the preferred embodiment, the multifunctional photopolymerizable compound is present in the overall composition in an amount of from about 1% to about 80% by weight, preferably from about 20% to about 70% based on the non-solvent parts of the overall radiation sensitive composition.

When photopolymerizable compositions are used they contain at least one free radical generating component which photolytically generates free radicals. Examples of free radical generating components include photoinitiators which themselves photolytically generate free radicals by a fragmentation or Norrish type 1 mechanism. These latter have a carbon-carbonyl bond capable of cleavage at such bond to form two radicals, at least one of which is capable of photoinitiation. Suitable initiators include aromatic ketones such as benzophenone, acrylated benzophenone, 2-thylanthraquinone, phenanthraquinone, 2-tert-butylanthraquinone, 1,2-benzanthraquinone, 2,3-benzanthraquinone, 2,3-dichloronaphthoquinone, benzyl dimethyl ketal and other aromatic ketones, e.g. benzoin, benzoin ethers such as benzoin methyl ether, benzoin ethyl ether, benzoin isobutyl ether and benzoin phenyl ether, methyl benzoin, ethyl benzoin and other benzoins; diphenyl-2,4,6-trimethyl benzoylphosphine oxide; and bis(pentafluorophenyl)titanocene. The free radical generating component may comprise a combination of radical generating initiators which generate free radicals by a Norrish type 1 mechanism and a spectral sensitizer. Such a combination includes 2-methyl-1-4'-(methylthio]-2-morpholinopropiophenone available from Ciba Geigy as Irgacure 907 in combination with ethyl Michler's ketone (EMK) which is 4,4'-bisdiethylaminobenzophenone; Irgacure 907 in combination with 2-isopropylthioxanthanone (ITX); benzophenone in combination with EMK; benzophenone in combination with ITX; 2-benzyl-2-N, N-dimethylamino-1-(4-morpholinophenyl)-1-butanone which is available from Ciba-Geigy as Irgacure 369 in combination with EMK; Irgacure 369 in combination with ITX. In such cases, it is preferred that the weight ratio of radical generating photoinitiator and spectral sensitizer ranges from about 5:1 to about 1:5. Other radical generators useful for this invention non-exclusively include triazines, such as chlorine radical generators such as 2-substituted-4,6-bis(trihalomethyl)-1,3,5-triazines. The foregoing substitution is with a chromophore group that imparts spectral sensitivity to the triazine to a portion of the electromagnetic radiation spectrum. Non-exclusive examples of these radical generators include 2-(4-methoxynaphth-1-yl)-4,6-bis(trichloromethyl)-1,3,5,-triazine; 2-(4-methylthiophenyl)-4,6-bis(trichloromethyl)-1,3,5,-triazine; 2-(4-methoxystyryl)-4,6-bis(trichloromethyl)-1,3,5-triazine; 2-(4-diethylaminophenyl-1,3-butadienyl)-4,6-bis(trichloromethyl)-1,3,5-triazine, among others. Also useful for the invention are Norrish type II mechanism compounds such as combinations of thioxanthones such as ITX and a source of abstractable hydrogen such as triethanolamine. The free radical generating component is present in an amount sufficient to effect photopolymerization of the photopolymerizable compound upon exposure to sufficient actinic radiation. The photoinitiator may comprise from about 1% to about 50% of the non-solvent parts of the overall composition, or more preferably from about 2% to about 40% and most preferably from about 5% to about 25%.

The negative working photoimageable compositions may also be produced by admixing a photoacid generator capable of generating an acid upon exposure to actinic radiation, with polymer precursors, such as epoxy precursors, which form polymers upon contact with the generated acid. The photoacid generator that may be used herein is one which generates an acid upon exposure to actinic radiation such as ultraviolet radiation. Photoacid generators are known in the photoimaging art and include, but are not limited to, onium compounds such as aryl derivatives of sulfonium, iodonium and diazonium salts, and organic compounds with photolabile halogen atoms. Preferred photoacid generators include tryarylsulfonium and diaryliodonium salts with hexafluorophosphate, hexafluoroantimonate, hexafluoroarsenate, and tetrafluoroborate anions. Non-limiting examples of suitable iodonium salts are salts of diphenyliodonium, dinaphthyliodonium, di(4-chlorophenyl)iodonium, tolyl(dodecylphenyl)iodonium, naphthylphenyliodonium, 4-(tri-fluoromethylphenyl)phenyliodonium, 4-ethylphenyl-phenyliodonium, di(4-acetylphenyl)iodonium, tolylphenyliodonium, 4-butoxyphenylphenyliodonium, di(4-phenylphenyl)iodonium, and the like. Di-phenyliodonium salts are preferred. Non-limiting examples of suitable sulfonium salts are salts of triphenylsufonium, dimethylphenylsulfonium, tritolylsulfonium, di(methoxynaphthyl)methylsulfonium, dimethylnaphthylsulfonium, 4-butoxyphenyldiphenylsulfonium, and 4-acetoxyphenyldiphenylsulfonium. Tri-phenylsulfonium salts are preferred. Organic compounds with photolabile halogen atoms include alpha-halo-p-nitrotoluenes, alpha-halomethyl-s-triazines, carbon tetrabromide, and the like. These acid generators may be used singly or in combination of two or more thereof The photoacid generator component is preferably present in an amount of from about 0.05% to about 20% of the total weight of the nonsolvent parts of the composition, more preferably from about 0.2% to about 10%, and most preferably from about 0.5% to about 5% by weight of the nonsolvent parts of the composition.

Suitable polymer precursors include epoxy precursors, for example, the diglycidyl ethers of resorcinol, catechol, hydroquinone, biphenol, bisphenol A, bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopenadiene-phenol resins, dicyclopentadiene-substituted phenol resins tetramethylbiphenol, tetramethyl-tetrabromobiphenol, any combination thereof and the like. Also suitable are the alkylene oxide adducts of compounds of more than one aromatic hydroxyl group per molecule such as the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenolaldehyde novolac resins, phenol-hydroxybenzaldehyde resins, cresol-hydroxybenzaldehyde resins, any combination thereof and the like. Also suitable are the glycidyl ethers of compounds having an average of more than one aliphatic hydroxyl group per molecule such as aliphatic polyols and polyether polyols. Non-limiting examples include polyglycidyl ethers of polyethylene glycols, polypropylene glycols, glycerol, polyglycerols, trimethylolpropane, butanediol, sorbitol, pentaerythritol, and combinations thereof. The epoxy precursor component is preferably present in an amount of from about 10% to about 90%, more preferably from about 20% to about 80% and most preferably from about 35% to about 65% by weight of the nonsolvent parts of the composition. Optionally the negative working photosensitive dielectric compositions can comprise a mixture of both an aaylate and an epoxy type composition as described above. The composition then preferably contains an optional organic acid anhydride monomer or polymer curing agent component. Nonlimiting examples of suitable anhydrides include styrene-maleic anhydride, styrene-alkyl methacrylate-itaconic anhydride, methyl methacrylate-butyl acrylate-itaconic anhydride, butyl acrylate-styrene-maleic anhydride, and the like. Preferred are styrene-maleic anhydride polymers with styrene to maleic anhydride molar ratio of from about 1:1 to about 3:1. Also suitable are dodecenyl succinic anhydride, trimellitic anhydride, chloroendic anhydride, phthalic anhydride, methylhexahydrophthalic anhydride, 1-methyl tetrahydrophthalic anhydride, hexahydrophthalic anhydride, methylnadic anhydride, methylbutenyltetrahydrophthalic anhydride, benzophenone terracarboxylic dianhydride, methylcyclohexenedicarboxylic anhydride. These acid anhydrides may be used singly or in combination of two or more thereof. This anhydride component is preferably present in the composition in an amount of from about 0.5% to about 90%, more preferably from about 1% to about 80% and most preferably from about 2% to about 60% by weight of the nonsolvent pats of the composition The composition then contains an optional aromatic hydroxyl containing compounds such as a phenolic monomer or polymer or mixture thereof. Suitable aromatic hydroxyl containing compounds which can be employed herein include, for example, compounds having an average of more than one phenolic hydroxyl group per molecule. Suitable such compounds include, for example, dihydroxy phenols, bi-phenols, bisphenols, halogenated bisphenols, alkylated bisphenols, trisphenols, phenol-aldehyde resins, halogenated phenol-aldehyde novolac resins, alkylated phenol-aldehyde novolac resins, phenol-hydroxybenzaldehyde resins, alkylated phenol-hydroxybenzaldehyde resins, the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenol-aldehyde novolac resins, cresol-aldehyde novolac resins, phenol-hydroxybenzaldehyde resins, cresol-hydroxybenzaldehyde resins, vinyl phenol polymers, any combination thereof and the like. When phenol containing compounds or polymers are used, it is preferably present in an amount of from about 0.5% to about 90%, more preferably from about 1% to about 80%, and most preferably from about 2% to about 60% based on the weight of the nonsolvent parts of the composition Optionally, the photosensitive dielectric composition may comprises a curing catalyst such as a thermal curing catalyst, for example, tertiary amines, imidazoles phosphines. The thermal curing catalyst may be present in an amount of from about 0.01% to about 10%, more preferably from about 0.02% to about 5% and most preferably from about 0.05% to about 2% by weight of the nonsolvent parts of the photosensitive dielectric composition.

The components of the photodielectric composition may be mixed in any suitable medium solvent and coated onto the conductive foil by any convenient means. Solvents which can be used in preparing the photopolymerizable composition of this invention include alcohols such as methanol, ethanol, propanol and butanol; ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate and methyl Cellosolve acetate; aromatic hydrocarbons such as toluene, xylene, benzene, ethylbenzene; halogenated hydrocarbons such as carbon tetrachloride, trichloroethylene, chloroform, 1,1,1-trichloroethane, 1,2-dichloroethane, monochlorobenzene, chloronaphthalene; ethers such as tetrahydrofuran, diethyl ethers ethylene glycol monoethyl ether acetate, ethylene glycol monomethyl ether, etc., dimethylformamide, dimethyl sulfoxide, etc., and mixtures thereof. The most preferred solvents are ethyleneglycol monomethylether, ethyleneglycol monoethylether and dimethyl formamide which dissolve the other components of the photographic coating. A suitable amount of the solvent which can be employed in the photopolymerizable composition of this invention ranges from about 2050% to about 1,0000%, preferably 50% to 5000%, by weight of the total non-solvent parts of the composition. The prepared photodielectric composition is then coated on the foil substrate by well known techniques such as but not limited to spin coating, slot die coating, extruding, Meyer rod drawing, blade drawing, screen coating, curtain coating, dip coating, or spray coating. Once the photodielectric composition coating is applied to the substrate, the solvents are evaporated to yield a dry coating weight of from about 20 to about 200 g/m$^2$, more preferably from about 40 to about 150 g/m$^2$, and most preferably from about 50 to about 100 g/m$^2$. A protective film may optionally be attached to the photodielectric composition until it is ready for use. Suitable photodielectric resins are commercially available under the trade name of XP-9500 from Shipley, and Probelec® XB-7081 from Ciba Specialty Chemicals.

As seen in FIG. 1, the photosensitive element comprising the conductive foil 2 and photosensitive dielectric composition 4 is then attached onto a pattern of conductive lines 6 which is on the surface of a substrate 8. Suitable substrates include those which are well known in the art for producing printed circuit boards such as polyesters, polyimides, epoxies, teflon and silicon. Most preferably the substrate is an insulating epoxy board. The pattern of conductive lines may be a metal such copper, copper alloys, aluminum, alloy, and the like, however, copper is most preferred. Within the context of the invention, the term metal lines includes electrical bonding pads. These may be produced by well known photolithographic and etching processes. Preferably the photosensitive element is attached to the metal lines and the substrate by means of lamination. That is, the photosensitive element and the substrate are passed through the nip of a set of heated rollers or a heated press in an laminating device with the temperature at about from about 90° C. to about 150° C.

As seen in FIG. 2, one then applies a layer of a photoresist 10 onto an opposite surface of foil 2. Notice that the dielectric composition layer 4 is now positioned both above and between the conductive lines 6. The photoresist may be positive working or negative working. Useful negative working photoresists include those compositions described above as being useful for the photosensitive dielectric composition. Suitable positive working photoresists are well known in the art and may comprise a positive working o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. The production of novolak resins is well known in the art. A procedure for their manufacture is described in *Chemistry* and *Application of Phenolic Resins*, Knop A and Scheib, W.; Springer Verlag, N.Y., 1979 in Chapter 4 which is incorporated herein by reference. Suitable novolak resins are water insoluble, aqueous alkali soluble resins having a preferred molecular weight in the range of from about 6,000 to about 14,000, or more preferably from about 8,000 to about 12,000. The amount of the sensitizers and binder can be experimentally varied by one skilled in the art depending on the desired product characteristics. The components are blended with a suitable solvent, such as those listed above, coated onto the conductive foil and dried. Suitable photoresist compositions are described in U.S. Pat. No. 4,588,670. Alternatively, the photoresist may be a dry film photoresist such as MacDermid Aquamer dry film photoresist. The photoresist is then imagewise exposed to actinic radiation. Such may either be through a photomask or by laser exposure. Exposed may be to ultraviolet radiation, such as in the 300 to 550 nanometer range through a photographic mask or computer directed laser pattern and developed. Suitable uv light sources are carbon arc lamps, xenon arc lamps, mercury vapor lamps which may be doped with metal halides (metal halide lamps), fluorescent lamps, argon filament lamps, electronic flash lamps and photographic floodlight lamps. Exposure is conducted to provide sufficient actinic energy to the element to permit a photochemical change in the image areas where the light sensitive composition is exposed through a mask and yet substantially prevent any photochemical change in the nonimage areas. The exposed photoresist is then developed to thereby form imagewise removed and imagewise nonremoved portions of the photoresist such that the imagewise removed portions are above at least some conductive lines. Typical developer compositions can be alkaline or neutral in nature and have a pH range of from about 5 to about 12. Developers are preferably formed from aqueous solutions of phosphates, silicates or metabisulfites. Such non-exclusively include mono-, di- and tri-alkali metal phosphate, sodium silicate, alkali metal metasilicate and alkali metabisulfite. Alkali metal hydroxides may also be used although these are not preferred. The developers may also contain art recognized surfactants, buffers, solvents and other ingredients.

Next one removes the portions of the conductive foil underlying the imagewise removed portions of the photoresist without removing the underlying photosensitive dielectric composition. The conductive foil portion to be removed may be so removed by such known techniques as etching and laser ablation. FIG. 3 shows the conductive foil with imagewise removed portion after removal of the balance of the photoresist layer.

Figure 5:
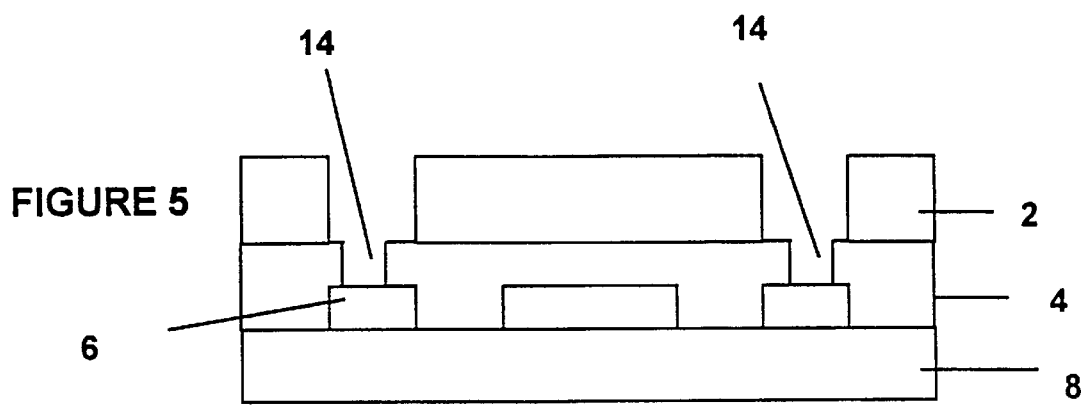
FIG. 5 shows the structure of FIG. 4 after removal of the nonimage areas of the dielectric composition to form vias.

Next one imagewise exposes a portion of the photosensitive dielectric composition to actinic radiation through the removed portions of the conductive foil in a manner described above. The exposed portions 12 of the dielectric layer are seen in FIG. 4. The conductive foil may optionally be used as a conformal mask, however, in the preferred embodiment, a second pattern is used, either a different mask or a different laser exposure pattern, to expose a part of the photosensitive dielectric composition which is revealed through the removed conductive foil portions. Thereafter the photosensitive dielectric composition is developed in a manner similar to that described above to thereby form imagewise removed and imagewise nonremoved portions of the photosensitive dielectric composition such that the imagewise removed portions form vias 14 to the conductive lines 6 as seen in FIG. 5.

The nonremoved portions of the photosensitive dielectric composition are then cured, preferably thermally cured. Curing may be effected by heating at temperatures of from about 90° C. to about 250° C. for from about 10 minutes to about 120 minutes.

Figure 6:
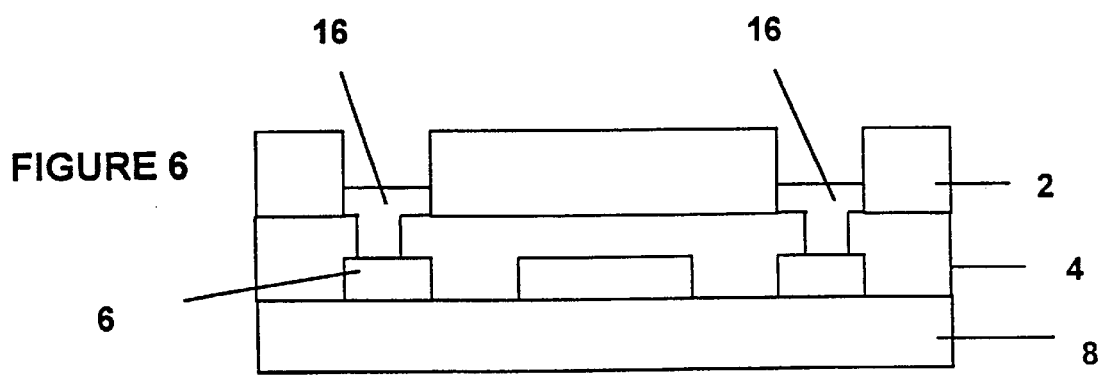
FIG. 6 shows the structure of FIG. 5 after plating the vias and providing an electrical connection between the conductive lines and the conductive foil.

One then electrically connects the conductive lines through the vias to a part of the conductive foil. This is preferably done by plating a metal 16 through the vias from the conductive lines 6 to a part of the conductive foil 2 as seen in FIG. 6. Such may be done by performing an electroless metal plating through the vias from the conductive lines to a part of the conductive foil, optionally followed by performing a metal electroplating step, each of which steps are well known in the art. Optionally the vias may be filled by a conductive paste such as U-300 available from Epoxy Technology, Inc. or organo-metallic compounds such Ormat available from Ormat Inc. of Carlstadt, Calif. Thereafter the conductive foil is preferably patterned by means well known in the art to thereby produce a pattern of conductive foil lines. Optionally the process steps may be repeated one or more times by attaching another photosensitive element onto the previously pattered conductive foil lines resulting from the process as described above to form a mutilayered structure. Optionally the entire process may be conducted one or more time on both sides of the substrate to provide a dual sided printed circuit board.

Figure 7:
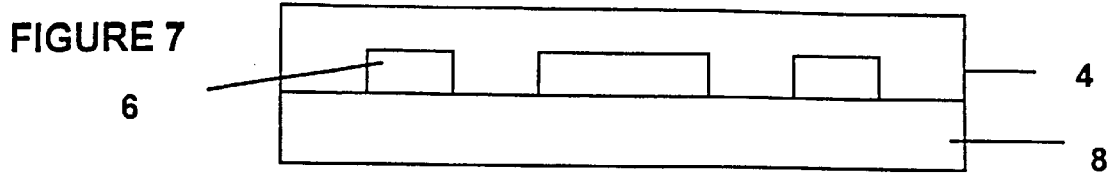
FIG. 7 shows another embodiment of the invention where the photosensitive element according to the invention laminated to a printed substrate having metallic lines and the entire conductive foil removed.
Figure 8:
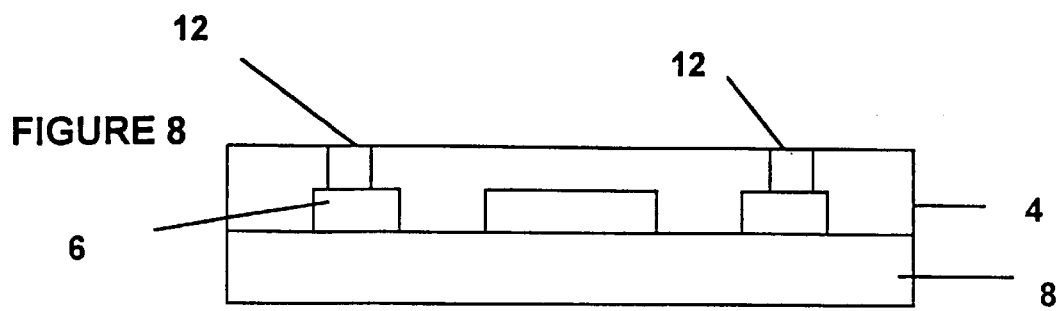
FIG. 8 shows the structure of FIG. 7 after an imaging of the dielectric composition.
Figure 9:
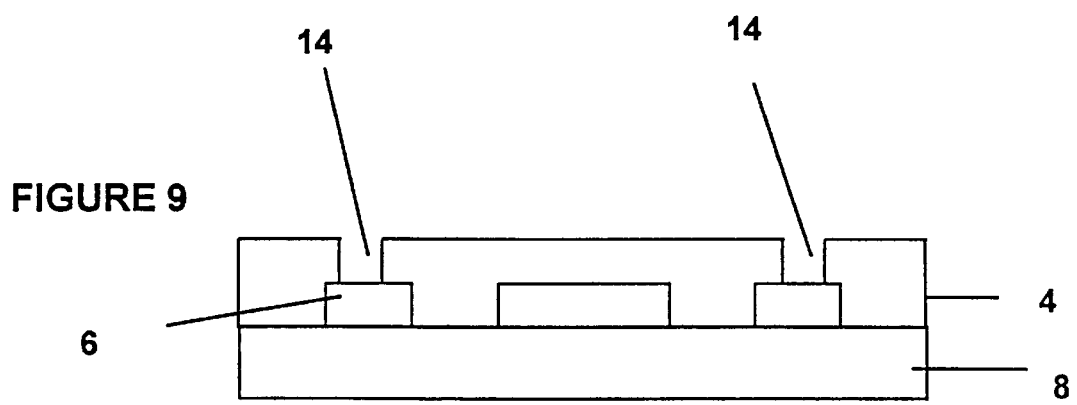
FIG. 9 shows the structure of FIG. 8 after removal of the nonimage areas of the dielectric composition to form vias.
Figure 10:
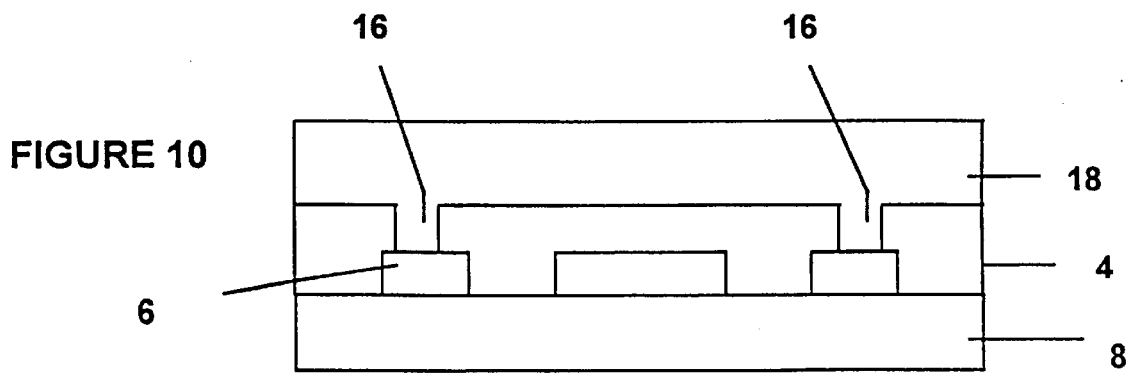
FIG. 10 the structure of FIG. 9 after plating the vias the top of the dielectric composition to provide a conductive top surface.

In another embodiment of the invention, the above photosensitive element is attached onto a pattern of conductive lines 6 on the surface of a substrate 8 as previously described in FIG. 1. Thereafter, as seen in FIG. 7, the entire conductive foil 2 is removed, such as by etching or laser ablation techniques leaving only the photosensitive dielectric composition 4 on and between the conductive lines 6 on the surface of a substrate 8. This preferably imparts a microroughened, matte surface to the photosensitive dielectric composition for better copper adhesion to the dielectric layer. As seen in FIGS. 8 and 9, the photosensitive dielectric composition 4 is then imagewise exposed to actinic radiation and developed to thereby form imagewise removed and imagewise nonremoved portions of the dielectric composition such that the imagewise removed portions are above at least some conductive lines thus forming vias 14 to the conductive lines 6. The nonremoved portions of the photosensitive dielectric composition are then cured. Then, as seen in FIG. 10, an electrically conductive layer 18, such as copper, is formed on the dielectric composition, preferably by plating, and forms an electrical connection from the conductive lines 6 through the vias 16 to the electrically conductive layer 18. Thereafter the electrically conductive layer 18 is patterned by means well known in the art to produce a pattern of conductive lines from the electrically conductive layer material.

The following non-limiting examples serve to illustrate the invention.

EXAMPLE 1

A photodielectric resin available from Shipley under the trade name of XP-9500 is coated on a half-ounce copper foil to form an approximately 2 mil thick resin coated copper foil. After coating, the coated foil is protected with a polyester release film until it is used to make a circuit. The photodielectric dry film backed by copper foil is laminated to a circuitized inner layer board by a hot roll laminator with the roll temperature at about 120° C. In the same step an additional layer of MacDermid Aqua Mer dry film photoresist is laminated on top of the copper foil. The ensemble is allowed to cool and the dry film photoresist is exposed to UV light through an artwork with the desired features. The artwork is clear except where it is desired to create photo-vias through the resin to the next layer of copper circuitry. The mask has dark areas (typically circular) which are one to two mils wider in diameter than the desired photo-via opening. The dry film photoresist is developed, exposing the copper foil in the regions that were beneath the circular dark regions of the mask during exposure. The copper foil is then etched away using a cupric chloride etchant at 50° C. After rinsing and drying, an annular ring type artwork is placed on top of the imaged foil. The annular ring mask is aligned such that the outer ring registers with the perimeter of the etched hole in the copper foil. This artwork is primarily dark, with the annular rings being clear. The annular ring is typically one to two mils wide. The panel is then exposed to UV at about 1 J/cm$^2$ through the artwork. The exposed panel is postbaked for 15 minutes at 90° C. and, after cooling down, the panel is then immersed in and sprayed with 2% caustic aqueous solution at 50° C. to strip the dry film photoresist and develop the via holes of the photosensitive layer down to the copper pads in the next layer. The holes are then desmeared with a potassium permangnate desmear solution, cleaned with conventional cleaning solutions, rinsed, and dried. The panel is baked at 170° C. for 2 hours to cure the dielectric layer. Following cure, the panel is plated with conventional electroless copper plating solutions followed by a conventional electroplating of an additional 1 mil of copper. Conductive vias between the two copper layers are thus formed. The outer layer circuitry is fabricated with conventional print and etch processes. A photoresist dry film is laminated onto the copper plane and imaged through UV exposure and developing. The panel is etched with conventional copper etchants. After etching the photoresist film is stripped with conventional strippers and the panel cleaned with conventional cleaning solutions. The above process is repeated as many times as necessary to fabricate a printed wiring board having the desired number of build-up layers.

EXAMPLE 2

The photodielectric resin available from Ciba Specialty Chemicals under the trade name of Probelec® XB-7081 is coated on a half-ounce copper foil to form an approximately 2 mil resin coated copper. The photodielectric dry film backed by copper foil is laminated to a circuitized inner layer board by a vacuum press at about 90° C. MacDermid Aqua Mer dry film photoresist is laminated on top of the copper foil with a hot roll laminator at 120° C. The ensemble is allowed to cool and the dry film photoresist is exposed to UV light through an artwork with the desired features. The artwork is clear except where it is desired to create photo-vias through the resin to the next layer of copper circuitry. The mask has dark areas (typically circular) which are one to two mils wider in diameter than the desired photo-via opening. The dry film photoresist is developed, exposing the copper foil in the regions that were beneath the circular dark regions of the mask during exposure. The copper foil is etched away using a cupric chloride etchant at 50° C. The photoresist layer is stripped away using conventional photoresist strippers. After rinsing and drying, an annular ring type artwork is placed on top of the imaged foil. The annular ring mask is aligned such that the outer ring registers with the perimeter of the etched hole in the copper foil. This artwork is primarily dark, with the annular rings being clear. The annular ring is typically one to two mils wide. The panel is then exposed to UV at 1.5 J/cm$^2$ through the artwork. The exposed panel is postbaked for 15 minutes at 130° C. and, after cooling down, the photodielectric layer is developed with gamma-butyrolactone to extend the via holes of the photodielectric layer down to the copper pads in the next layer. The holes are then desmeared with a potassium permangnate desmear solution, cleaned with conventional cleaning solutions, rinsed, and dried. The panel is baked at 170° C. for 2 hours to cure the dielectric layer. Following cure, the panel is plated with conventional electroless copper plating solutions followed by a conventional electroplating of an additional 1 mil of copper. Conductive vias between the two copper layers are thus formed. The outer layer circuitry is fabricated with conventional print and etch processes. A photoresist dry film is laminated onto the copper plane and imaged through UV exposure and developing. The panel is etched with conventional copper etchants. After etching the photoresist film is stripped with conventional strippers and the panel cleaned with conventional cleaning solutions. The above process is repeated as many times as necessary to fabricate a printed wiring board having the desired number of build-up layers.

EXAMPLE 3

The photodielectric resin available from Shipley under the trade name of XP-9500 is coated on a half-ounce copper foil to form an approximately 3 mil thick resin coated copper foil. After coating, the coated foil is protected with a polyester release film until it is used to make a circuit. The photodielectric dry film backed by copper foil is laminated to a circuitized inner layer board by a hot roll laminator with the roll temperature at about 120° C. The copper foil is etched away using a cupric chloride etchant at 50° C. After rinsing and drying, the panel is exposed to UV through an artwork with desired features at 1 J/cm$^2$. The panel is then exposed to UV at about 1 J/cm$^2$ through the artwork. The exposed panel is postbaked for 15 minutes at 90° C. and, after cooling down, the panel is then immersed in and sprayed with 2% caustic aqueous solution to develop the via holes of the photosensitive layer down to the copper pads in the next layer. The holes are then desmeared with a potassium permangnate desmear solution, cleaned with conventional cleaning solutions, rinsed, and dried. The photosensitive layer is flood exposed at 1 J/cm$^2$ and cured at 150° C. for 1 hour. Following cure, the panel is plated with conventional electroless copper solutions followed by an additional electro-plating of 1–2 mils of copper. Conductive vias between the two copper layers are thus formed. The outer layer circuitry is fabricated with conventional print and etch processes. A photoresist dry film is laminated onto the copper plane and imaged through UV exposure and developing. The copper layer is etched with conventional copper etchants. After etching the photoresist film is stripped with conventional strippers and the panel cleaned with conventional cleaning solutions. The above process is repeated as many times as necessary to fabricate a printed wiring board having the desired number of build-up layers. The board is finally finished with whatever additional layers such as solder mask, solder, electroless gold, etc. are desired.

From the above it can be seen that high density, built-up multilayer printed circuit boards can be produced by constructing microvias with photoimageable dielectric materials.

What is claimed is:

1. A process for producing a printed circuit board which comprises;
    (a) attaching a photosensitive element onto a pattern of conductive lines on the surface of a substrate wherein there are spaces between the conductive lines; which photosensitive element comprises a negative working photosensitive dielectric composition on a surface of a conductive foil, such that the photosensitive dielectric composition is positioned on the conductive lines and in the spaces between the conductive lines;

(b) applying a layer of a photoresist onto an opposite surface of said foil;

(c) imagewise exposing the photoresist to actinic radiation and developing the photoresist to thereby form imagewise removed and imagewise nonremoved portions of the photoresist such that the imagewise removed portions are above at least one conductive line;

(d) removing the portion of the conductive foil underlying the imagewise removed portions of the photoresist without removing the underlying photosensitive dielectric composition;

(e) imagewise exposing a portion of the photosensitive dielectric composition to actinic radiation through the removed portions of the conductive foil; developing the photosensitive dielectric composition to thereby form imagewise removed and imagewise nonremoved portions of the photosensitive dielectric composition such that the imagewise removed portion form vias to the conductive lines;

(f) curing the nonremoved portions of the photosensitive dielectric composition;

(g) electrically connecting the conductive lines though the vias to a part of the conductive foil; and (h) patterning the conductive foil to thereby produce a pattern of conductive foil lines.

2. The process of claim 1 further comprising repeating steps (a) through (h) at least once by attaching another photosensitive element according to step (a) onto the previously patterned conductive foil lines resulting from step (h).

3. The process of claim 1 wherein step (g) comprises plating a metal through the vias from the conductive lines to a part of the conductive foil.

4. The process of claim 1 wherein step (g) comprises performing an electroless metal plating through the vias from the conductive lines to a part of the conductive foil.

5. The process of claim 1 wherein step (g) comprises performing an electroless metal plating through the vias from the conductive lines to a part of the conductive foil followed by performing a metal electroplating step.

6. The process of claim 1 wherein step (g) comprises filling the vias with a conductive paste or organometallic compound.

7. The process of claim 1 wherein step (f) is conducted by heating at a temperature of from about 90° C. to about 250° C.

8. The process of claim 1 wherein the foil comprises copper, copper alloys, aluminum or aluminum alloys.

9. The process of claim 1 wherein the conductive lines comprise copper, copper alloys, aluminum or aluminum alloys.

10. The process of claim 1 wherein the substrate comprises an insulating material.

11. The process of claim 1 wherein the photoresist is a negative working photosensitive composition.

12. The process of claim 1 wherein the photoresist is a positive working photosensitive composition.

13. The process of claim 1 wherein the photoresist is exposed through a first photographic mask and the photosensitive dielectric composition is exposed through a different second photographic mask.

14. A process for producing a printed wiring board which comprises:

(a) applying a layer of a negative working photosensitive dielectric composition onto a surface of a conductive foil thereby forming a photosensitive element;

(b) attaching the conductive foil via the photosensitive dielectric composition onto a pattern of conductive lines on the surface of a substrate wherein there are spaces between the conductive lines;

(c) applying a layer of a photoresist onto an opposite surface of said foil;

(d) imagewise exposing the photoresist to actinic radiation and developing the photoresist to thereby form imagewise removed and imagewise nonremoved portions of the photoresist such that the imagewise removed portions are above at least one conductive line;

(e) removing the portions of the conductive foil underlying the imagewise removed portions of the photoresist without removing the underlying photosensitive dielectric compositions;

(f) imagewise exposing a portion of the photosensitive dielectric composition to actinic radiation through the removed portions of the conductive foil; developing the photosensitive dielectric composition to thereby form imagewise removed and imagewise nonremoved portions of the photosensitive dielectric composition such that the imagewise removed portions form vias to the conductive lines;

(g) curing the nonremoved portions of the photosensitive dielectric composition;

(h) electrically connecting the conductive lines thought the vias to a part of the conductive foil; and (i) patterning the conductive foil to thereby produce a pattern of conductive foil lines.

15. The process of claim 14 further comprising repeating steps (a) through (i) at least once by attaching another photosensitive element according to step (a) onto the previously patterned conductive foil lines resulting from step (i).

16. A process for producing a printed circuit board which comprises;

(a) attaching a photosensitive element onto a pattern of conductive lines on the surface of a substrate; which photosensitive element comprises a negative working photosensitive dielectric composition on a surface of a conductive foil, such that the photosensitive dielectric composition is positioned on the conductive lines;

(b) removing the conductive foil to expose the photosensitive dielectric composition wherein the exposed photosensitive dielectric composition has a microroughened surface;

(c) imagewise exposing a portion of the microroughened photosensitive dielectric composition to actinic radiation and developing the dielectric composition to thereby form imagewise removed and imagewise nonremoved portions of the microroughened dielectric composition such that the imagewise removed portions are above at least one conductive line;

(d) curing the nonremoved portions of the microroughened photosensitive dielectric compositions;

(e) simultaneously forming an electrically conductive layer on the microroughened surface of the nonremvoed protions of the dieletric composition and electrically connecting the conductive lines through the vias to the electrically conductive layer; and (f) patterning the electrically conductive layer to thereby produce a pattern of conductive lines.

17. The process of claim 16 further comprising repeating steps (a) through (f) at least once by attaching another photosensitive element according to step (a) onto the previously pattered conductive lines resulting from step (f).

18. The process of claim 16 wherein step (e) comprises plating a metal through the vias from the conductive lines to the electrically conductive layer.

19. The process of claim 16 wherein step (e) comprises performing an electroless metal plating through the vias from the conductive lines followed by performing a metal electroplating step from the conductive lines to the electrically conductive layer.

20. The process of claim 16 wherein the foil comprises copper, copper alloys, aluminum or aluminum alloys.

21. The process of claim 16 wherein the conductive lines comprise copper, copper alloys, aluminum or aluminum alloys.

22. The process of claim 16 wherein the substrate comprises an insulating material.

23. A process for producing a printed circuit board which comprises (a) applying a layer of negative working photosensitive dielectric composition onto a surface of a conductive foil thereby forming a photoseneitive element;

(b) attaching a conductive foil via the photosensitive dielectric composition onto a pattern of conductive lines on the surface of a substrate;

(c) removing the conductive foil to expose the photosensitive dielectric composition wherein the exposed photosensitive dielectric composition has a microroughened surface;

(d) imagewise exposing a portion of the microroughened photosensitive dielectric composition to actinic radiation and developing the microroughened dielectric composition to thereby form imagewise removed and imagewise nonremoved portions of the microroughened dielectric composition such that the imagewise removed portions are above at least one conductive line thus forming vias to the conductive lines;

(e) curing the nonremoved portions of the microroughened photosensitive dielectric composition;

(f) simultaneously forming an electrically conductive layer on the microroughened surface of the nonremoved portions of the dielectric composition and electrically connecting the conductive lines though the vias to the electrically conductive layer; and (g) patterning the electrically conductive layer to thereby produce a pattern of conductive lines.

24. The process of claim 23 further comprising repeating steps (a) through (g) at least once by attaching another photosensitive element according to step (a) onto the previously pattered conductive foil lines resulting from step (g).

* * * * *

UNITED STATES PATENT AND TRADEMARK OFFICE
CERTIFICATE OF CORRECTION

PATENT NO.    : 6,255,039 B1
DATED         : July 3, 2001
INVENTOR(S)   : Xu et al.

It is certified that error appears in the above-identified patent and that said Letters Patent is hereby corrected as shown below:

Column 4,
Line 16, delete "fonms" and replace with -- forms --.

Column 5,
Line 17, delete "2-thylanthraquinone" and replace with -- 2-ethylanthraquinone --.

Column 7,
Line 1, delete "aaylate" and replace with -- acrylate --.

Column 8,
Line 15, delete "5000%" and replace with -- 500% --.

Signed and Sealed this

Twenty-sixth Day of February, 2002

Attest:

JAMES E. ROGAN
Attesting Officer    Director of the United States Patent and Trademark Office